United States Patent [19]

Hill

[11] 4,454,523
[45] Jun. 12, 1984

[54] HIGH VOLTAGE FIELD EFFECT TRANSISTOR

[75] Inventor: Lorimer K. Hill, Cupertino, Calif.

[73] Assignee: Siliconix Incorporated, Santa Clara, Calif.

[21] Appl. No.: 248,814

[22] Filed: Mar. 30, 1981

[51] Int. Cl.³ .............. H01L 29/48; H01L 29/06; H01L 29/80

[52] U.S. Cl. .............. 357/15; 357/20; 357/22; 357/88

[58] Field of Search .............. 357/22 V, 22 G, 22 S, 357/35, 36, 88, 91, 20, 15

[56] References Cited

U.S. PATENT DOCUMENTS

| | | | |
|---|---|---|---|
| 3,953,879 | 4/1976 | O'Connor-d'Arlach et al. | 357/86 X |
| 4,223,328 | 9/1980 | Terasawa et al. | 357/20 |

FOREIGN PATENT DOCUMENTS

| | | | |
|---|---|---|---|
| 55-68678 | 5/1980 | Japan | 357/22 G |
| 55-91181 | 7/1980 | Japan | 357/22 V |

OTHER PUBLICATIONS

Von Muench, W., "Producing Semiconductor Devices by Oriented Lateral Overgrowth," IBM Tech. Discl. Bull., vol. 10, No. 10, pp. 1469–1470, Mar. 1968.

Primary Examiner—Andrew J. James
Assistant Examiner—J. L. Badgett
Attorney, Agent, or Firm—Flehr, Hohbach, Test, Albritton & Herbert

[57] ABSTRACT

A high voltage field effect transistor includes a source region in a first major surface of a semiconductor body and a drain region in a second major surface of the semiconductor body. A first gate region is formed in the first major surface and is surrounded by the source regions. A second gate region surrounds the source region and includes a buried region extending into the semiconductor body between the source and drain regions. The buried gate structure can be fabricated by epitaxial grown over diffused regions in a semiconductor substrate, or alternatively ion implantation can be employed to form the buried gate regions.

1 Claim, 18 Drawing Figures

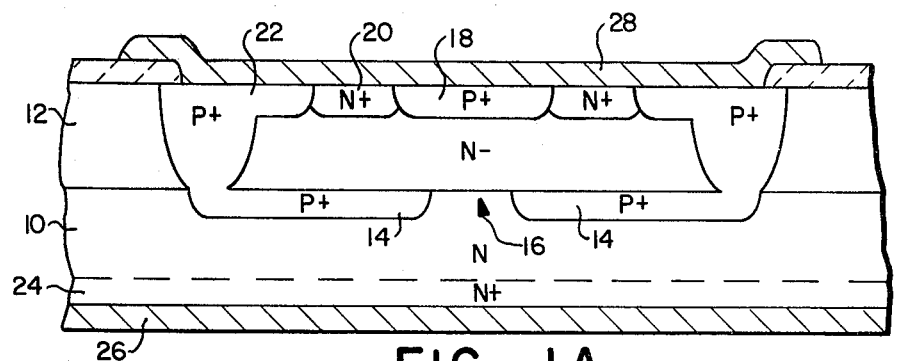
FIG.—1A
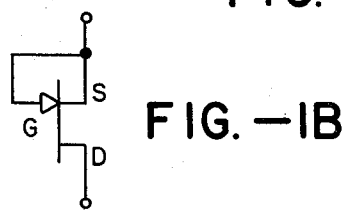
FIG.—1B
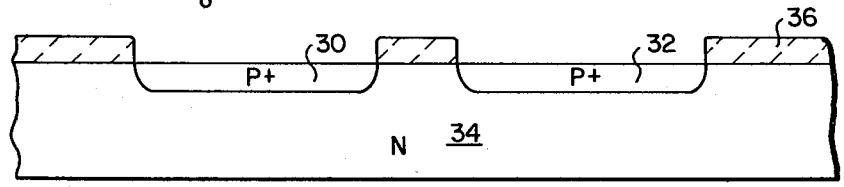
FIG.—2A
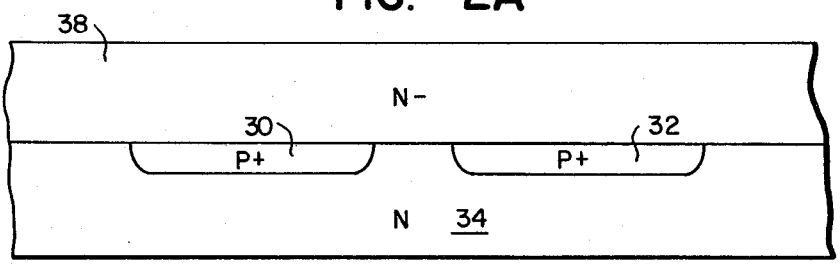
FIG.—2B
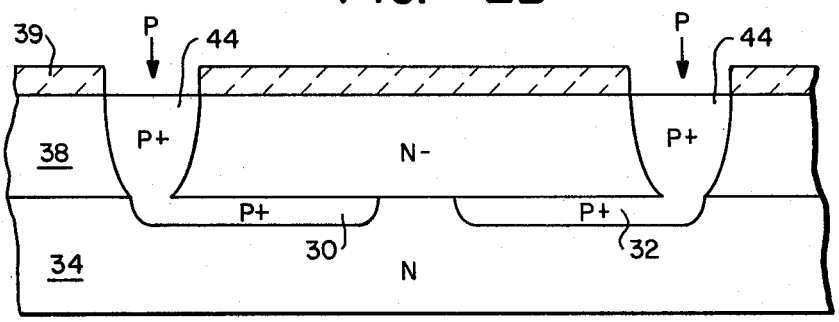
FIG.—2C

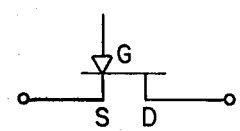
FIG.—3B
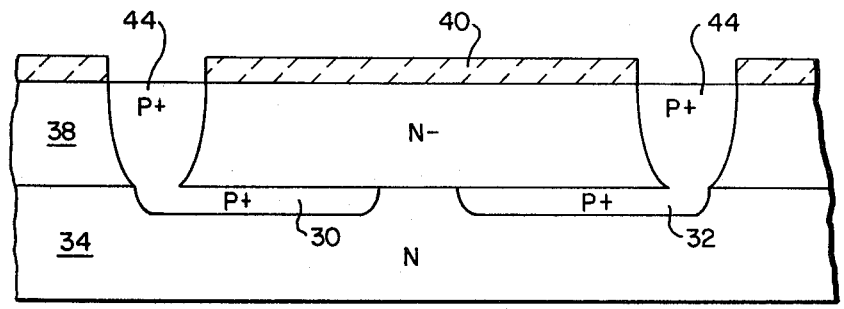
FIG.—4A
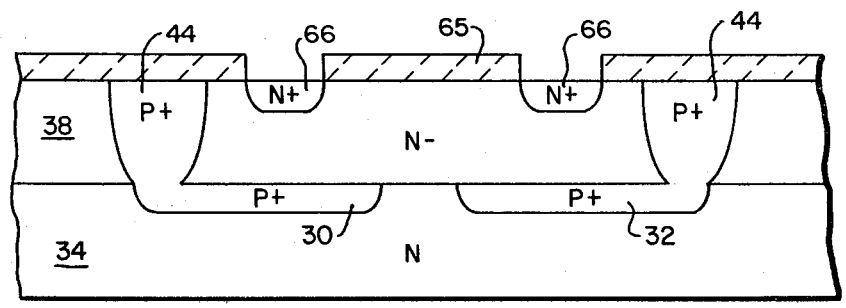
FIG.—4B
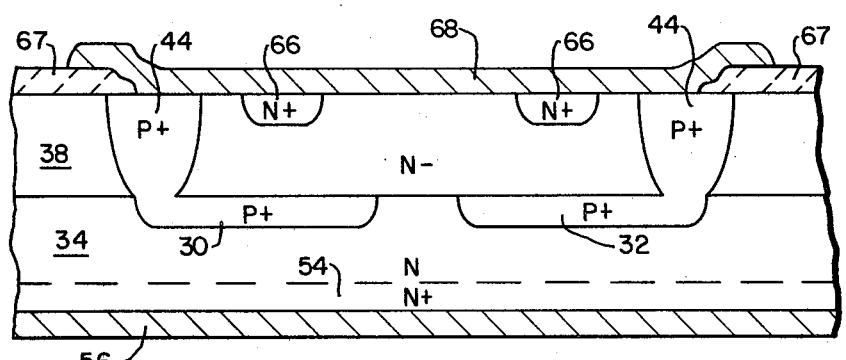
FIG.—4C

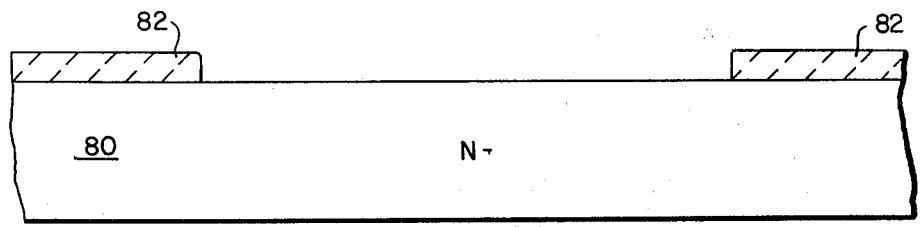
FIG.—5A
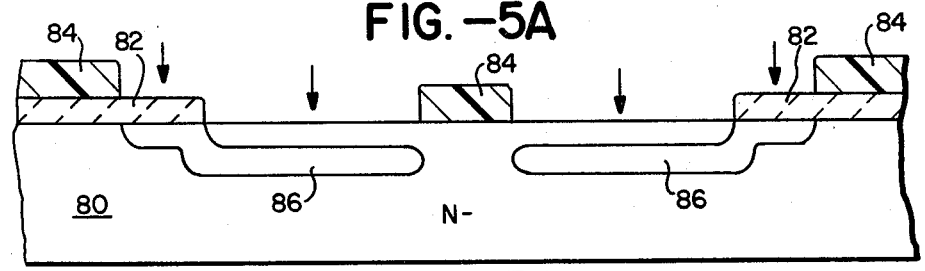
FIG.—5B
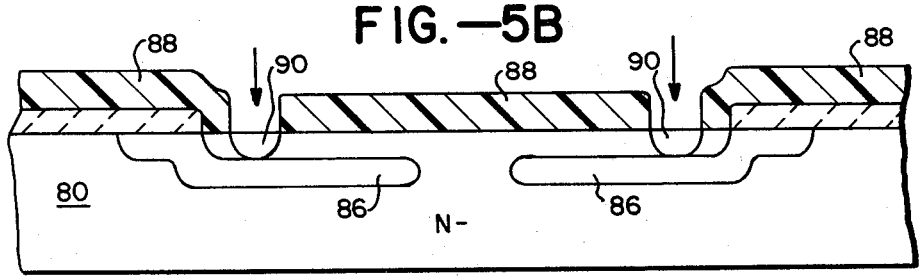
FIG.—5C
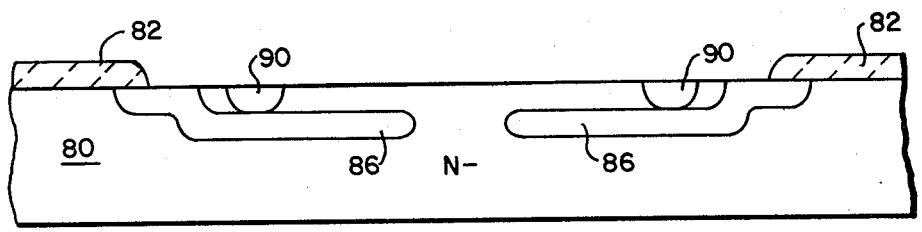
FIG.—5D
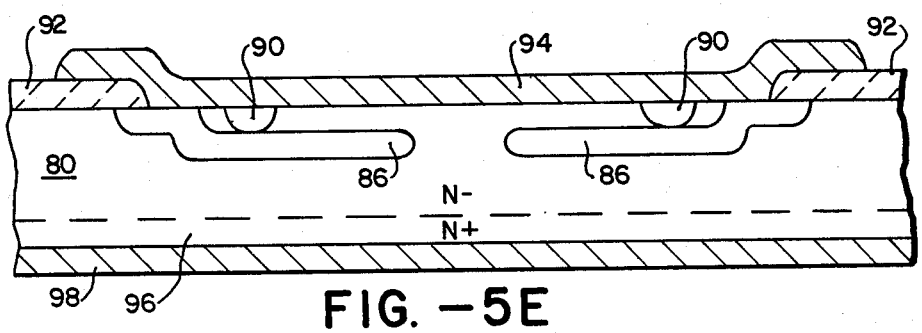
FIG.—5E

HIGH VOLTAGE FIELD EFFECT TRANSISTOR

This invention relates generally to semiconductor devices and technology, and more particularly the invention relates to field effect transistors and methods of fabricating field effect transistors.

The field effect transistor is a semiconductor device in which current flow in a channel between source and drain regions is controlled by biasing gate regions associated with the channel. In high voltage applications a field effect transistor must exhibit a high breakdown voltage as well as high output impedance. The horizontal field effect transistor in which the source and drain regions are formed in one surface of a semiconductor body achieves a high output impedance due to the horizontal spacing of the source and drain regions. A vertical field effect transistor provides a high breakdown voltage by placing the source and drain regions in opposing surfaces of the semiconductor body.

The primary object of the present invention is the provision of a high voltage field effect transistor which combines the high output impedance of a horizontal field effect transistor and the high breakdown voltage of a vertical field effect transistor.

Another object of the invention is a method of fabricating an improved high voltage field effect transistor.

A feature of the invention is a buried gate region and a surface gate region which define a current channel between source and drain regions in opposing surfaces of a semiconductor body.

Briefly, in accordance with the invention a semiconductor body of a first conductivity type and having first and second major parallel surfaces includes a source region of first conductivity type in the first major surface and a drain region of first conductivity type in the second major surface. A first gate region of opposite conductivity type is formed in the first major surface and is surrounded by the source region. A second gate region of opposite conductivity type is formed in the first major surface and surrounds the source region, the second gate region including a buried region extending into the semiconductor body between the source and the drain regions and thereby defining a current path which extends in a direction parallel to the major surfaces from the source to the end of said buried region where it becomes perpendicular to the major surfaces and extends to the drain. A first electrical contact is made to the drain region and a second electrical contact is made to a source region and to the first and second gate regions. Alternatively, the gate regions can be contacted separately from the source region. In one embodiment the first gate region is formed by the Schottky effect from a metal contact with the first major surface.

In fabricating the field effect transistor in accordance with the invention the buried regions can be formed by dopant diffusion in the surface of a substrate with epitaxial growth of lightly doped material over the diffused regions. Subsequent diffusion steps form the source and gate regions in the surface of the epitaxial layer. Alternatively, the buried region can be formed by selective ion implantation in a semiconductor body without the need for epitaxial growth.

The invention and objects and features thereof will be more readily apparent from the following detailed description and appended claims when taken with the drawings, in which:

FIG. 1A is a side view in section of one embodiment of a field effect transistor in accordance with the invention.

FIG. 1B is an electrical schematic of the field effect transistor of FIG. 1A.

FIGS. 2A–2F are side views in section illustrating the steps in fabricating the device of FIG. 1 in accordance with one embodiment of the invention.

FIG. 3B is an electrical schematic of the device of FIG. 3A.

FIGS. 4A–4C are sectional views illustrating steps in fabricating another embodiment of the device in accordance with the invention.

FIGS. 5A–5E are side views in section illustrating another method of fabricating a field effect transistor in accordance with the present invention.

Figure 2D:
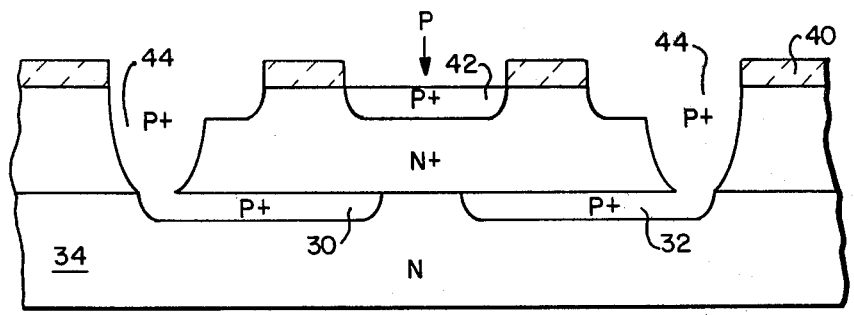

Referring now to the drawings, FIG. 1A is a side view in section of one embodiment of a high voltage field effect transistor in accordance with the present invention. The transistor comprises an N type substrate 10 having a dopant concentration on the order of $10^{14}$ atoms per cubic centimeter and an N− epitaxial layer 12 grown thereon and having a dopant concentration on the order of $10^{14}$ atoms per cubic centimeter and a thickness on the order of 10 μm. Formed in the semiconductor body at the interface of the epitaxial layer 12 and substrate 10 is a buried P+ layer 14 having a dopant concentration on the order of $10^{18}$ atoms per cubic centimeter. The P+ region 14 surrounds a portion 16 of the substrate 10. Formed on the top surface of the semiconductor body is a first P+ gate region 18 having a dopant concentration on the order of $10^{18}$ atoms per cubic centimeter and an N+ source region 20 having a dopant concentration on the order of $10^{20}$ atoms per cubic centimeter. The source region 20 surrounds gate region 18, and surrounding the source region 20 is a second gate region 22 having a dopant concentration on the order of $10^{18}$ atoms per cubic centimeter. The gate region 22 extends inwardly through the epitaxial layer 12 and contacts the buried P+ region 14. An N+ region 24 is formed in the bottom surface of the semiconductor body for contact with an electrode 26 of aluminum, for example. Another contact 28 is formed on the top surface of the semiconductor body in contact with the gate regions 18 and 22 and the source region 20. Thus, the transistor of FIG. 1A is a two terminal device with the source and gate being tied to one contact and the second contact to the drain, as shown schematically in FIG. 1B.

The structure of FIG. 1A is a high voltage device since the source and drain regions are formed in opposing surfaces of the semiconductor body. In addition, a high output impedance is achieved by the gate regions 14 and 18 defining a channel through the epitaxial layer which interconnects the source and drain regions. Importantly, the buried gate 14 separates the source and drain regions and lies beneath a portion of the surface gate 18.

The structure of FIG. 1A can be readily fabricated using known semiconductor fabrication techniques as illustrated in the section views of FIGS. 2A–2E. In FIG. 2A a continuous P+ diffused region 30, 32 is formed in a surface of an N type substrate 34 by use of silicon oxide mask 36. In FIG. 2B the silicon oxide 36 is removed from the surface and an N− epitaxial layer 38 is grown over the diffused region 30 and 32.

In FIG. 2C a silicon oxide mask 39 is provided on the top surface of the epitaxial layer, and a continuous P+ region 44 is diffused in the surface of the epitaxial layer. By first diffusing the gate region 44, the diffusion can be extended through the epitaxial layer 38 and into contact with the buried layer 30, 32. Subsequent masking and diffusion creates the shallow region 42 as shown in FIG. 2D. This diffusion may be done over gate region 44 if increased concentration is needed for ohmic contact.

Figure 2E:
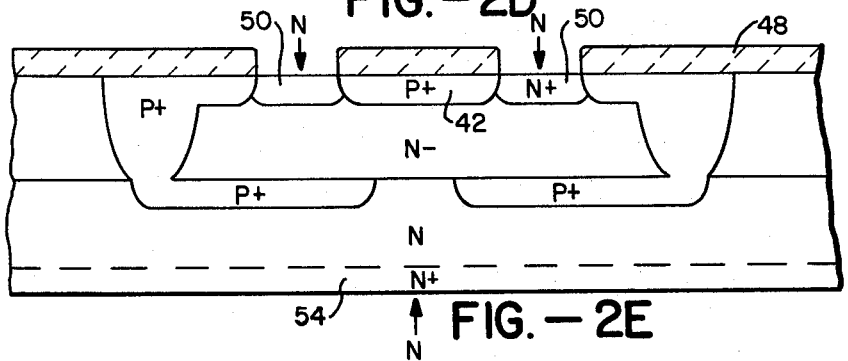
Figure 2F:
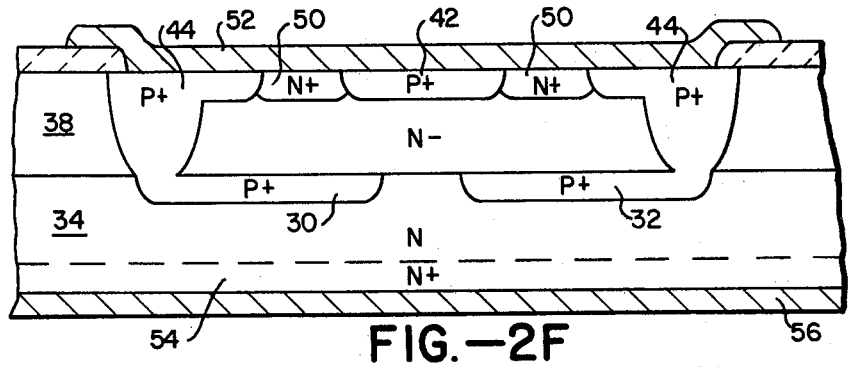

In FIG. 2E another silicon oxide mask 48 is formed on the surface of the epitaxial layer and N type dopant is diffused into the source region 50 which surrounds the gate region 42. In this embodiment the source and gate regions can abut since a single contact 52 will be formed on the epitaxial layer to the source and gate regions as shown in FIG. 2F. An N+ region 54 can be formed in the bottom surface in the semiconductor substrate to facilitate contact to the drain region by a contact 56. Contacts 52 and 56 can be aluminum, for example.

Figure 3A:
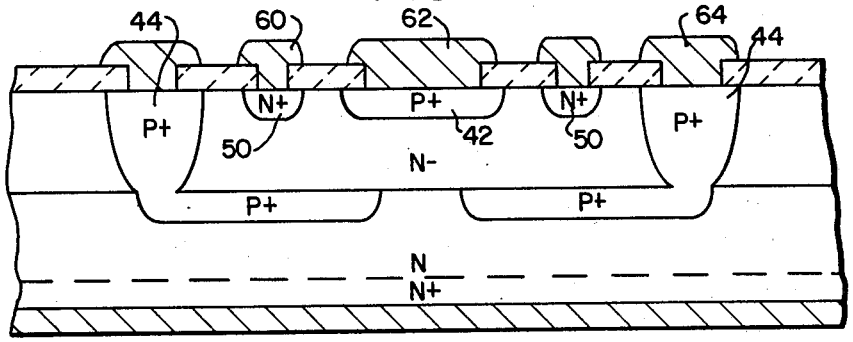
FIG. 3A is a side view in section of another embodiment of a field effect transistor in accordance with one embodiment of the invention.

FIG. 3A is an alternative embodiment in which separate contacts are made to the source region and gate regions of the device. In this embodiment the source region 50 is spaced from the gate regions 42 and 44, and a source contact 60 is made to the source region 50 and separate gate contacts 62 and 64 are made to the gate regions 42 and 44, respectively. By electrically interconnecting the two gate electrodes 62 and 64, a three terminal device is provided as shown schematically in FIG. 3B.

In another embodiment similar to the FIG. 2F embodiment, the gate region 42 need not be formed by diffusion as an aluminum contact with the N− epitaxial layer will form a Schottky barrier and in effect form a P type surface gate region. In fabricating this embodiment the same steps as illustrated in FIGS. 2A-2C are employed to form the structure as shown in FIG. 4A. Thereafter, as shown in FIG. 4B a new oxide layer 65 is formed on the top surface and the N+ source region 66 are diffused into the epitaxial layer 38. Subsequently, as shown in FIG. 4C a new oxide layer 67 is formed on the surface and selectively removed whereby an aluminum contact 68 is formed in contact with the source region 66 and the epitaxial layer to form the top gate region by the Schottky contact with the epitaxial layer. Again, the N+ drain region 54 and contact 56 are formed in the bottom surface.

In an alternative method of fabricating a field effect transistor structure in accordance with the invention, ion implantation can be employed without the need for epitaxial growth as shown in side views in section of FIGS. 5A-5E. In FIG. 5A an N type silicon substrate 80 having a dopant concentration on the order of $10^{14}$ atoms per cubic centimeter is provided with a silicon oxide layer 82 on the top surface. Layer 82 has a thickness of about 1.1 micron. Thereafter, as shown in FIG. 5B a photoresist layer 84 is formed over part of the oxide layer 82, and the two layers cooperatively provide a mask for substantially implanting P-type ions in the top surface of the substrate 80. Boron ions can be implanted at 470 kev whereby the P+ implanted region 86 forms adjacent to the surface beneath the silicon oxide layer 82 and within the silicon substrate when the surface is not masked. The photoresist masked surface regions are not implanted.

Thereafter, as shown in FIG. 5C another photoresist mask 88 is provided on the top surface with windows allowing the implantation of N-type ions into the top surface to form the N+ source region 90. Phosphorous ions implanted at 50 kev will form surface oriented regions 90.

After removal of the photoresist and anneal of the ion implants, the oxide layer 82 is partially removed as shown in FIG. 5D. Thereafter, as shown in FIG. 5E an aluminum layer 94 is formed in contact with the source region 90 and the gate region 86. Again, a top gate region is formed by the Schottky contact of the aluminum and the N− substrate surface within the source region. A drain region 96 and drain contact 98 are formed in the bottom surface.

By using the buried gate region in combination with a top gate for defining a channel between a source region in one major surface of a semiconductor body and a drain region in another major surface of a semiconductor body, both high breakdown voltage and high output impedance is achieved in a field effect transistor for high voltage applications. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A high voltage field effect transistor comprising:
   a semiconductor body of a first conductivity type and having first and second major parallel surfaces,
   a drain region of said first conductivity type in said first major surface,
   a source region of said first conductivity type in said second major surface,
   a first gate region of opposite conductivity type in said second major surface and surrounded by said source region, said first gate region comprising a Schottky barrier region,
   a second gate region of said opposite conductivity type in said second major surface and surrounding said source region, said second gate region extending into said semiconductor body between said source region and said drain region and thereby defining a current path between said source and drain regions which lies between said second gate region and said first gate region,
   a first contact to said drain region, and
   a second contact to said source region and to said first and second gate regions.

* * * * *